(12) United States Patent
Blanchard

(10) Patent No.: US 9,679,999 B2
(45) Date of Patent: Jun. 13, 2017

(54) BIDIRECTIONAL BIPOLAR TRANSISTORS WITH TWO-SURFACE CELLULAR GEOMETRIES

(71) Applicant: Ideal Power Inc., Austin, TX (US)

(72) Inventor: Richard A. Blanchard, Los Altos, CA (US)

(73) Assignee: Ideal Power, Inc., Austin, TX (US)

( * ) Notice: Subject to any disclaimer, the term of this patent is extended or adjusted under 35 U.S.C. 154(b) by 0 days.

(21) Appl. No.: 15/090,582

(22) Filed: Apr. 4, 2016

(65) Prior Publication Data

US 2016/0329418 A1  Nov. 10, 2016

Related U.S. Application Data

(60) Provisional application No. 62/142,016, filed on Apr. 2, 2015.

(51) Int. Cl.

| | |
|---|---|
| *H01L 27/082* | (2006.01) |
| *H01L 29/66* | (2006.01) |
| *H01L 29/747* | (2006.01) |
| *H01L 29/40* | (2006.01) |
| *H01L 29/06* | (2006.01) |
| *H01L 29/16* | (2006.01) |

(52) U.S. Cl.
CPC ......... *H01L 29/747* (2013.01); *H01L 27/082* (2013.01); *H01L 27/0823* (2013.01); *H01L 29/0692* (2013.01); *H01L 29/16* (2013.01); *H01L 29/407* (2013.01); *H01L 29/66234* (2013.01); *H01L 29/66295* (2013.01)

(58) Field of Classification Search
CPC ............... H01L 27/082; H01L 27/0823; H01L 29/66234; H01L 29/66295; H01L 29/73; H01L 29/7322
See application file for complete search history.

(56) References Cited

U.S. PATENT DOCUMENTS

| | | | |
|---|---|---|---|
| 9,337,262 B2* | 5/2016 | Blanchard | ........... H01L 29/7397 |
| 2014/0375287 A1* | 12/2014 | Blanchard | ........... H01L 29/0817 |
| | | | 323/271 |

* cited by examiner

*Primary Examiner* — Phat X Cao
(74) *Attorney, Agent, or Firm* — Groover & Associates PLLC; Robert O. Groover, III; Gwendolyn G. Corcoran

(57) ABSTRACT

A two-surface bidirectional power bipolar transistor is constructed with a two-surface cellular layout. Each emitter/collector region (e.g. doped n-type) is a local center of the repeated pattern, and is surrounded by a trench with an insulated field plate, which is tied to the potential of the emitter/collector region. The outer (other) side of this field plate trench is preferably surrounded by a base connection region (e.g. p-type), which provides an ohmic connection to the substrate. The substrate itself serves as the transistor's base.

6 Claims, 5 Drawing Sheets

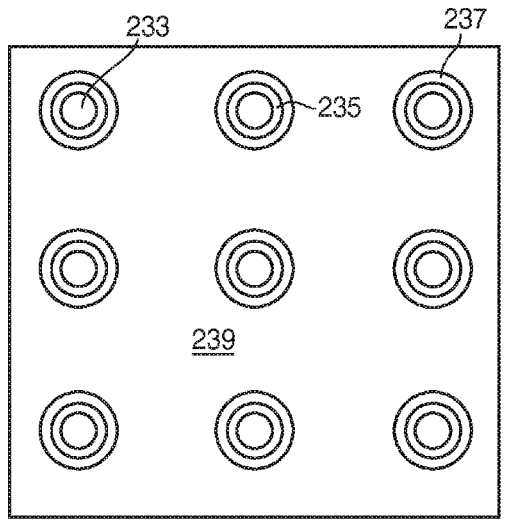
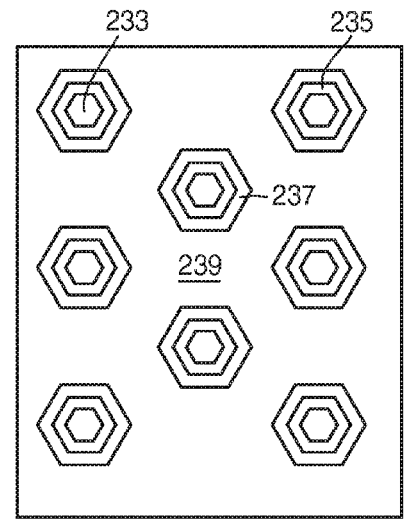
FIG. 1A         FIG. 1B
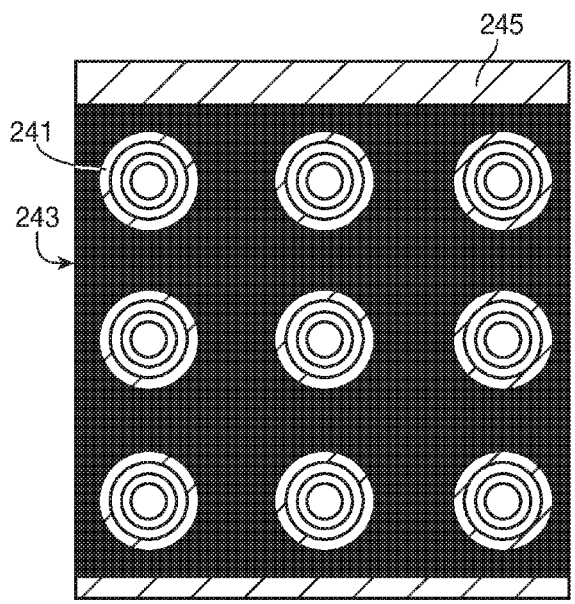
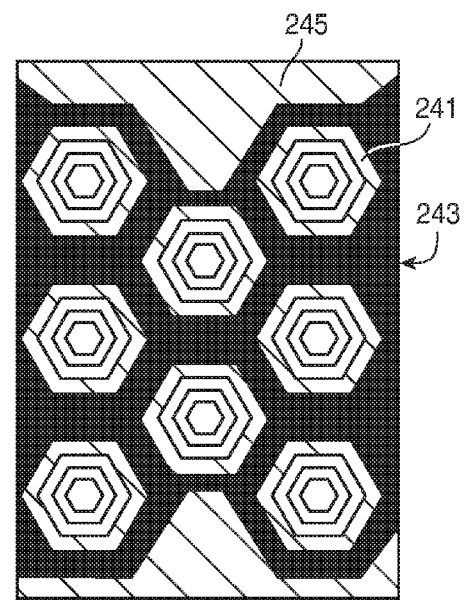
FIG. 2A         FIG. 2B

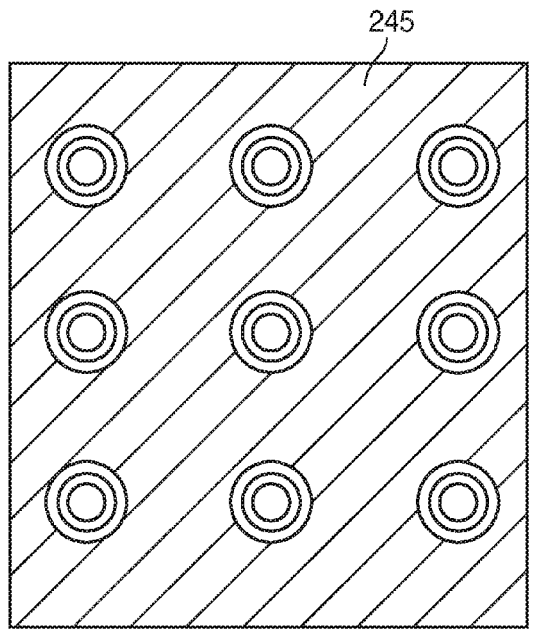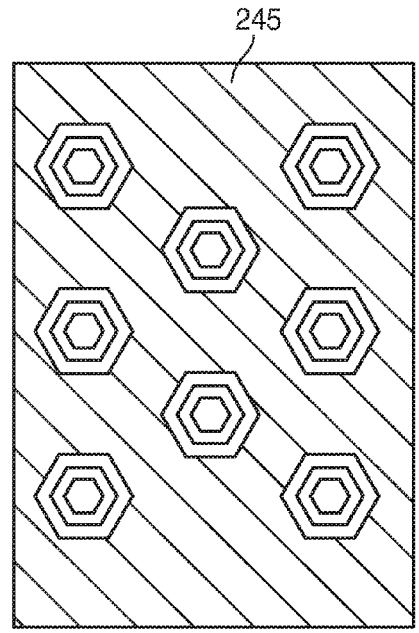
FIG. 3A  FIG. 3B
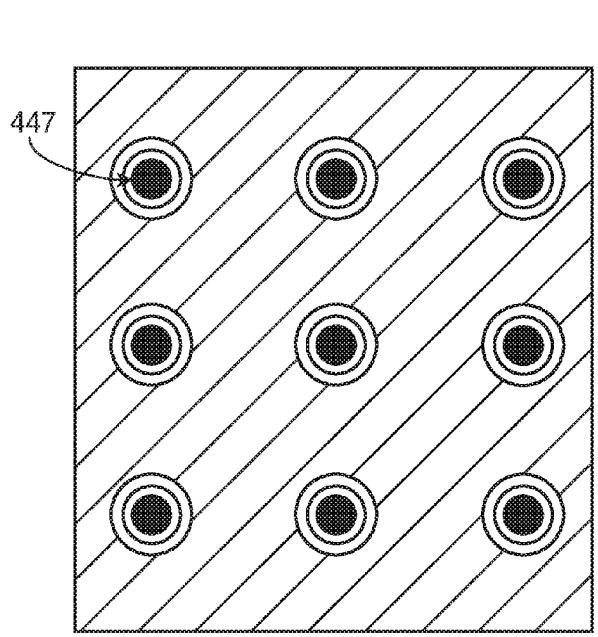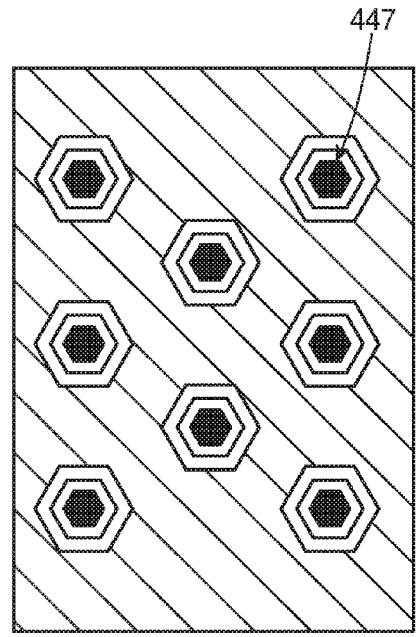
FIG. 4A  FIG. 4B

BIDIRECTIONAL BIPOLAR TRANSISTORS WITH TWO-SURFACE CELLULAR GEOMETRIES

CROSS-REFERENCE

Priority is claimed from U.S. application 62/142,016, which is hereby incorporated by reference.

BACKGROUND

The present application relates to bidirectional bipolar transistors which have separate base connection regions, as well as separate emitter/collector diffusions, on both surfaces of a monolithic semiconductor die.

Note that the points discussed below may reflect the hindsight gained from the disclosed inventions, and are not necessarily admitted to be prior art.

Bi-directional bipolar transistors or "B-TRANs" have been proposed for use as high voltage bi-directional switches, based on their low on-voltages at high current levels. Earlier patent applications of Ideal Power Inc., many of which are now issued, have described many features of B-TRAN devices and methods, including many options, improvements, and alternatives. For example, see U.S. Pat. Nos. 9,029,909, 9,190,894, 9,203,400, 9,203,401, and 9,209,713, all of which are hereby incorporated by reference; also see pending U.S. application Ser. No. 14/566,576, Ser. No. 14/599,191, Ser. No. 14/882,316, Ser. No. 14/918,440, Ser. No. 14/937,814, Ser. No. 14/992,971, Ser. No. 14/935,344, Ser. No. 15/018,844, Ser. No. 15/055,514, Ser. No. 15/083,217, and Ser. No. 15/083,230. All of these applications and patents, and all their direct and indirect priority applications, are hereby incorporated by reference.

The structure of an NPN B-TRAN device, in one example, is shown in FIG. 6. An enhancement to the B-TRAN structure of FIG. 6 is shown in FIG. 7. In this figure, the trench that was filled with dielectric in FIG. 26 has a trench which is lined with a dielectric (e.g. silicon dioxide), and is subsequently filled with conductive polycrystalline silicon. The polycrystalline silicon electrode located in each trench is in turn electrically connected to the n-type emitter diffusion region present on at least one side of the trench.

BIDIRECTIONAL BIPOLAR TRANSISTORS WITH TWO-SURFACE CELLULAR GEOMETRIES

The present application teaches, among other innovations, a cellular layout for two-surface bidirectional power bipolar transistors. Each emitter/collector region (e.g. doped n-type) is a local center of the repeated pattern, and is surrounded by an insulating trench. Most preferably this insulating trench contains an insulated field plate which is tied (in metal) to the potential of the emitter/collector region. The outer (other) side of this insulating trench is preferably surrounded by a base connection region (e.g. p-type), which provides an ohmic connection to the substrate. (The substrate itself serves as the transistor's base; typically the substrate is thinned to achieve the desired breakdown voltage at the desired substrate doping.)

U.S. application Ser. No. 15/083,230 describes a B-TRAN in which the emitter/collector regions are laid out as repeating stripes. The present application provides a different approach. By avoiding the repeated parallel trenches, the present application avoids any problem of cumulative residual stress.

BRIEF DESCRIPTION OF THE DRAWINGS

The disclosed inventions will be described with reference to the accompanying drawings, which show important sample embodiments and which are incorporated in the specification hereof by reference, wherein:

FIGS. 1A-1B show sample embodiments of two B-TRAN cellular structures.

FIGS. 2A-2B show sample embodiments of one step in fabricating the structures of FIGS. 1A and 1B, respectively.

FIGS. 3A-3B show sample embodiments of another step in fabricating the structures of FIGS. 1A and 1B, respectively.

FIGS. 4A-4B show sample embodiments of another step in fabricating the structures of FIGS. 1A and 1B, respectively.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

Figure 5A:
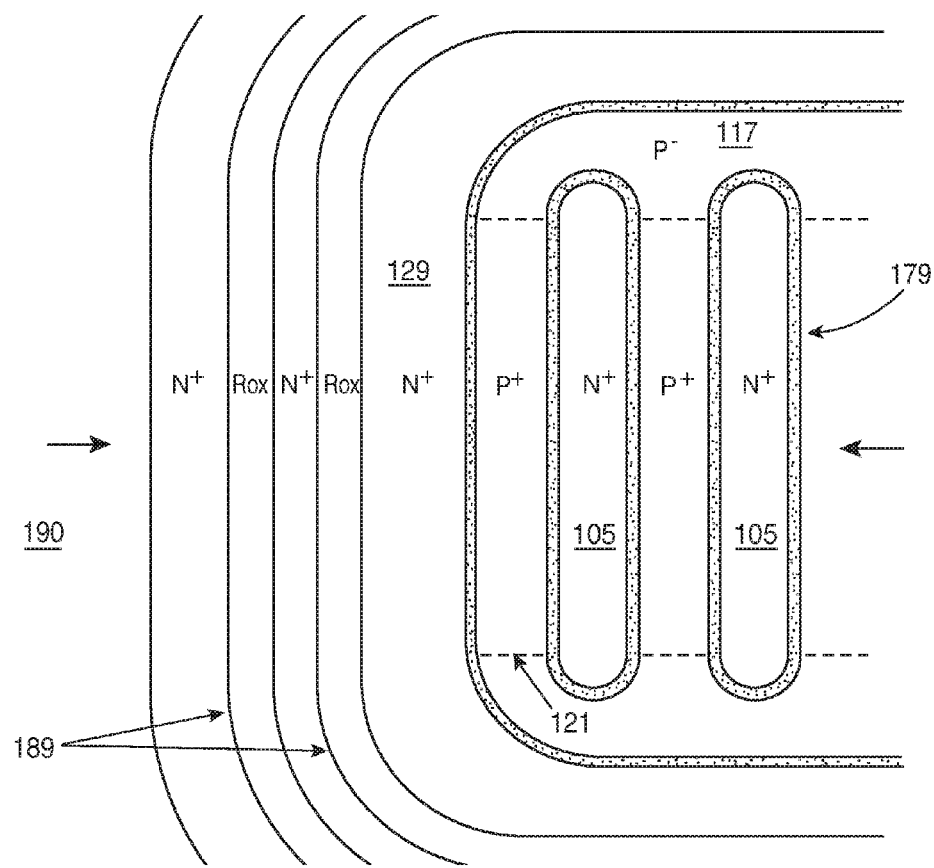
FIGS. 5A-5B show two views of one sample embodiment of a B-TRAN structure.
Figure 5B:
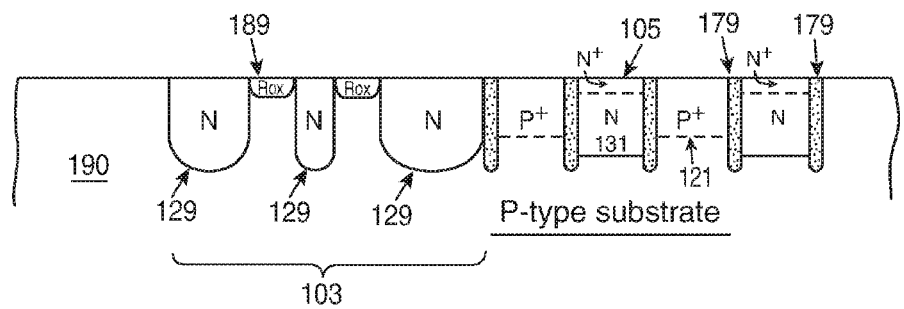
Figure 6:
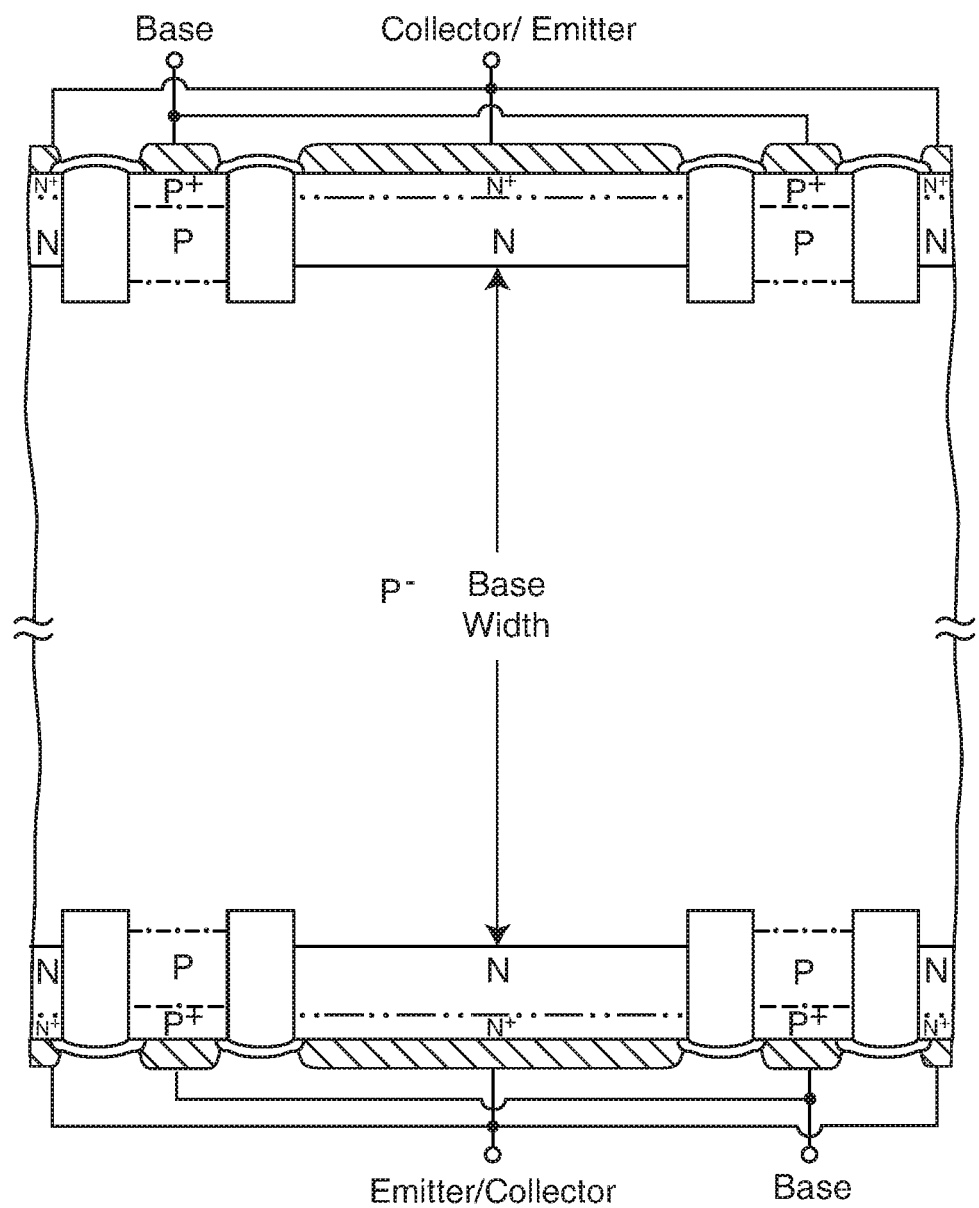
FIGS. 6 and 7 show two sample embodiments of B-TRAN structures.
Figure 7:
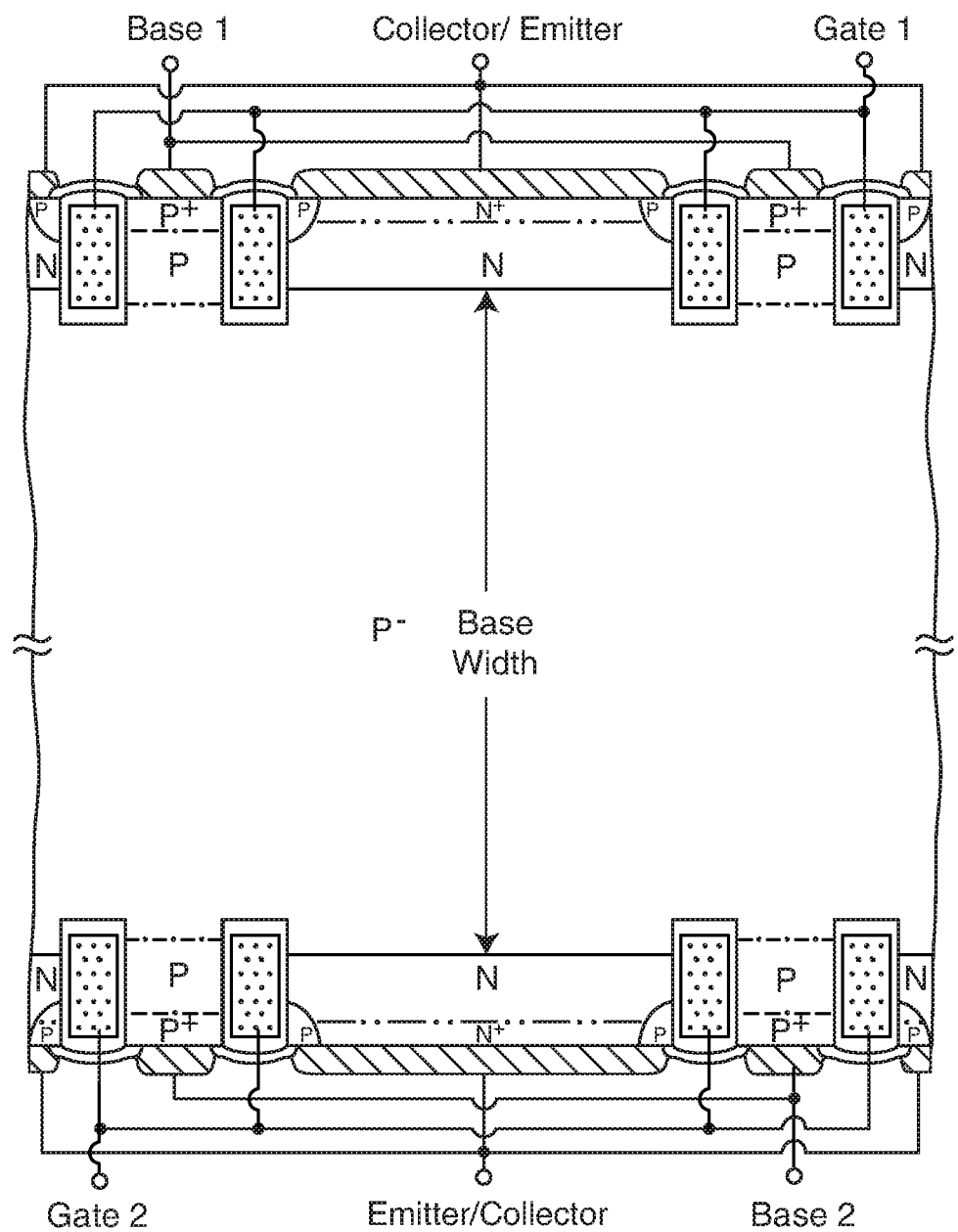

Bi-directional bipolar transistors or "B-TRANs" have been proposed for use as high voltage bi-directional switches, based on their low on-voltages at high current levels. The work that has been initiated to date on B-TRAN devices by the inventors uses interdigitated layouts, with their emitter/collector regions and their base regions arranged parallel to each other across the surface of the device. The requirements that the emitter/collector regions function as efficient emitters, and are also able to withstand the peak applied reverse voltage places severe requirements on the layouts that can be used for B-TRAN devices. These layouts, such as the one seen in the sample embodiment of FIGS. 5A-5B, are efficient, but have a significant disadvantage. Specifically, when a filled trench is used to at the perimeter of the emitter regions to obtain the needed breakdown voltage, the presence of a large number of parallel trenches on the wafer surface can result in wafer bowing. Such wafer bowing is believed to be the result of the forces that occur when trenches are filled with one or more materials such as silicon dioxide, silicon nitride, or doped polycrystalline silicon. Silicon dioxide and silicon nitride both have coefficients of thermal expansion that differ from that of silicon, and are formed in trenches at elevated temperatures. As the wafers cool to room temperature from the processing temperature, this difference in expansion or contraction is believed to cause wafer bowing. Two other circumstances that contribute to this potential problem are the percentage of the surface area that contains trenches, particularly in large devices, and the need to use wafers for bidirectional devices that are much thinner than conventional starting wafers. The use of a stepping pattern that places some dice with their trenches parallel to the wafer flat and some dice with their trenches perpendicular to the same flat is discussed in a separate Invention Disclosure. The present Invention Disclosure describes the use of cellular layouts to address wafer bowing. If this bowing too great, it may be impossible to process wafers, particularly through the photo masking step, which requires wafers that vary only slightly from being completely flat.

Cellular geometries are used in vertical power MOSFET technology where the source and drain terminals carry large currents, while the gate lead carries only the much lower gate current. B-TRAN devices are significantly different, since all three terminals, emitter, base, and collector, conduct considerable current at different times during device operation. Use of a cellular structure in a B-TRAN requires a second metal layer to be successful. Then, the first set of regions on each surface of the B-TRAN, like the base regions, can be contacted using the first metal layer, while the second set of regions on each surface of the B-TRAN, like the emitter/collector regions can be contacted using the second metal layer. A device layout of this type allows base region contacts to be made near emitter/collector region contacts, reducing resistance. Examples of possible cellular B-TRAN layouts are shown in FIGS. 1A-1B.

In FIGS. 1A-1B, the regions, starting with the innermost, are n+ collector/emitter regions 233 (and Metal 2, not shown), field plate 235, and p-type base 237. The cells are separated by regions of p+ base contact region 239. These layouts show a circular cell on a regular X-Y array and a hexagonal cell layout on an offset X-Y array. FIG. 1A shows the circular cell pattern, and FIG. 1B the hexagonal cell pattern.

FIGS. 2A and 2B show base contact masks 243 for the circular and the hexagonal cellular patterns, respectively.

P+ base contact regions 239 are overlain by Metal 1 layer 245. P+ base contact regions 239 (under metal layer 245) are separated from p-type base 237 by intermediary region 241.

Field plate 235 is fabricated in a trench, surrounds doubly-doped emitter/collector regions 233, and is connected to the emitter using one of the metal layers, preferably (though not always) Metal 2 layer (not shown). Metal 1 layer 245 (again, preferably but not necessarily) contacts the base regions outside of the repeated cell structure.

FIGS. 3A and 3B show Metal 1 layer 245 for the circular cell pattern and the hexagonal cellular pattern, respectively. FIGS. 4A and 4B show respective emitter contact masks 447 for each pattern. Metal 2 is just a sheet of metal for each region contacting the emitters, so is not shown. Other cellular geometries including squares and rectangles may also be used, with either a regular X-Y array or an offset X-Y array. Other metal patterns may also be used.

FIG. 5A shows a top view of the B-TRAN device as well as a cross section of the device. FIG. 5A shows that the termination region 103 uses the same diffused regions that form the emitter/collector regions of the B-TRAN. Specifically:

1. The diffused field-limiting rings 129 are formed by the same doping and diffusion steps as the B-TRAN emitter/collector regions 105. The use of diffused regions formed by the same step reduces the number of steps in the fabrication sequence.

2. Both the emitter regions 105 and the diffused n-type regions that form the field-limiting rings 129 preferably include both deep and shallow n-type doping components, formed by implanting both phosphorus and arsenic into the p-type substrate using the same mask. This process sequence saves the use of one masking layer, while also providing a deep n-type junction capable of withstanding a high voltage, as well as a shallow, heavily doped n++ region at the surface that forms a low resistance ohmic contact with the metal layer.

In one example, the two n-type dopants are phosphorus and arsenic, and each is implanted at a dose of 2 or $3 \times 10^{15}$ cm$^{-2}$. Arsenic will have a shorter diffusion length than phosphorus (in silicon, for a given thermal history), so that the emitter/collector regions have both a high concentration at shallow depths, and a reasonably large junction depth.

Optionally an additional shallow n++ "plug" implant can be used to minimize specific contact resistance.

Optionally antimony can be substituted for arsenic if desired.

The example shown in FIG. 5A includes field-limiting rings 129. For clearer illustration, only three field-limiting rings 129 are shown in FIG. 1A, but this is simplified.

In this example, recessed oxide regions 189 ("Rox") are interposed between adjacent field limiting rings 129. In some examples (but not necessarily in every implementation), the recessed oxide regions 189 are not associated with the field plates which can be emplaced in the trenches 179. The field plates are formed of poly silicon, later in the process.

Note also, in FIG. 5A, that each emitter/collector region 105 is shaped like a stripe, and is bordered, along its long sides, by a p+ base contact region 119 inside p-type base contact border region 121. The short side of each emitter/collector region 105 is bordered by p− base region 117. This is useful in optimizing the emitter/collector regions to have uniform turnoff, and to have fairly uniform on-state current density across their width.

The dopant profile of the base contact regions 119 is preferably formed by several diffusion components. The background wafer doping, in this example, is p-type. In addition, two implantations of boron and/or boron difluoride dopants are used, in a preferred example, to achieve good contact resistance and reduce the series resistance from the contact area to the p-type substrate. The total p-type doping introduced into the base contact areas 119, in this example, is around $2 \times 10^{15}$ cm$^{-2}$.

The base-to-emitter/collector isolation trenches 179, in this example, can include insulated polysilicon field plates which are electrically connected to the adjacent n-type emitter/collector region.

Advantages

The disclosed innovations, in various embodiments, provide one or more of at least the following advantages. However, not all of these advantages result from every one of the innovations disclosed, and this list of advantages does not limit the various claimed inventions.

Improved wafer stability;

Reduced risk of wafer bowing.

According to some but not necessarily all embodiments, there is provided: A two-surface bidirectional power bipolar transistor is constructed with a two-surface cellular layout. Each emitter/collector region (e.g. doped n-type) is a local center of the repeated pattern, and is surrounded by a trench with an insulated field plate, which is tied to the potential of the emitter/collector region. The outer (other) side of this field plate trench is preferably surrounded by a base connection region (e.g. p-type), which provides an ohmic connection to the substrate. The substrate itself serves as the transistor's base.

According to some but not necessarily all embodiments, there is provided: A bidirectional power bipolar transistor device, comprising: a p-type semiconductor die having, on each of the two surfaces thereof, a plurality of separate n-type emitter/collector regions, each of which is surrounded by a first insulating trench; a plurality of p-type base connection regions, each surrounding one of the first insulating trenches; a p-type base connection contact region, surrounding multiple ones of the base connection regions, and set back from the insulating trenches; wherein the density of the emitter/collector regions on either of the surfaces is the same as the density of the emitter/collector regions on the other of the surfaces.

According to some but not necessarily all embodiments, there is provided: A bidirectional power bipolar transistor device, comprising: a p-type semiconductor die having, on each of the two surfaces thereof, a plurality of separate n-type emitter/collector regions, each of which is surrounded by a first insulating trench; a plurality of p-type base connection regions, each surrounding one of the first insulating trenches; a p-type base connection contact region, surrounding multiple ones of the base connection regions, and set back from the insulating trenches; wherein the density of the emitter/collector regions on either of the surfaces is the same as the density of the emitter/collector regions on the other of the surfaces; wherein the emitter/collector regions on the two surfaces are aligned with each other.

According to some but not necessarily all embodiments, there is provided: A bidirectional power bipolar transistor device, comprising: a p-type semiconductor die having, on each of the two surfaces thereof, a plurality of separate n-type emitter/collector regions, each of which is surrounded by a first insulating trench; a plurality of p-type base connection regions, each surrounding one of the first insulating trenches; a p-type base connection contact region, surrounding multiple ones of the base connection regions, and set back from the insulating trenches; a metallization connected to said emitter/collector regions and to said insulating trenches; wherein the density of the emitter/collector regions on either of the surfaces is the same as the density of the emitter/collector regions on the other of the surfaces.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is, among others (and, without exclusion, in addition to any other points which are indicated herein as inventive and/or surprising and/or advantageous):

1. A bidirectional power bipolar transistor device, comprising:
    a p-type semiconductor die having, on each of the two surfaces thereof, a plurality of separate n-type emitter/collector regions, each of which is surrounded by a first insulating trench;
    a plurality of p-type base connection regions, each surrounding one of the first insulating trenches;
    a p-type base connection contact region, surrounding multiple ones of the base connection regions, and set back from the insulating trenches;
    wherein the density of the emitter/collector regions on either of the surfaces is the same as the density of the emitter/collector regions on the other of the surfaces.

2. The device of claim 1, wherein the semiconductor die is silicon.

3. A bidirectional power bipolar transistor device, comprising:
    a p-type semiconductor die having, on each of the two surfaces thereof, a plurality of separate n-type emitter/collector regions, each of which is surrounded by a first insulating trench;
    a plurality of p-type base connection regions, each surrounding one of the first insulating trenches;
    a p-type base connection contact region, surrounding multiple ones of the base connection regions, and set back from the insulating trenches;
    wherein the density of the emitter/collector regions on either of the surfaces is the same as the density of the emitter/collector regions on the other of the surfaces;
    wherein the emitter/collector regions on the two surfaces are aligned with each other.

4. The device of claim 3, wherein the semiconductor die is silicon.

5. A bidirectional power bipolar transistor device, comprising:
    a p-type semiconductor die having, on each of the two surfaces thereof, a plurality of separate n-type emitter/collector regions, each of which is surrounded by a first insulating trench;
    a plurality of p-type base connection regions, each surrounding one of the first insulating trenches;
    a p-type base connection contact region, surrounding multiple ones of the base connection regions, and set back from the insulating trenches;
    a metallization connected to said emitter/collector regions and to said insulating trenches;
    wherein the density of the emitter/collector regions on either of the surfaces is the same as the density of the emitter/collector regions on the other of the surfaces.

6. The device of claim 5, wherein the semiconductor die is silicon.

\* \* \* \* \*